(12) United States Patent
Judge

(10) Patent No.: US 9,039,107 B2
(45) Date of Patent: May 26, 2015

(54) SLIDE ASSEMBLY

(71) Applicant: Jonathan Manufacturing Corporation, Irvine, CA (US)

(72) Inventor: Ronald J. Judge, Corona, CA (US)

(73) Assignee: Jonathan Manufacturing Corporation, Irvine, CA (US)

( * ) Notice: Subject to any disclaimer, the term of this patent is extended or adjusted under 35 U.S.C. 154(b) by 0 days.

(21) Appl. No.: 13/766,168

(22) Filed: Feb. 13, 2013

(65) Prior Publication Data
US 2014/0226924 A1 Aug. 14, 2014

Related U.S. Application Data

(60) Provisional application No. 61/762,499, filed on Feb. 8, 2013.

(51) Int. Cl.
A47B 95/00 (2006.01)
H05K 7/14 (2006.01)

(52) U.S. Cl.
CPC .................... H05K 7/1489 (2013.01)

(58) Field of Classification Search
USPC ........ 312/334.4, 334.5, 334.8, 334.9, 334.11, 312/334.12, 334.44, 334.46, 334.47, 333; 384/21
See application file for complete search history.

(56) References Cited

U.S. PATENT DOCUMENTS

| 1,736,108 | A |   | 11/1929 | Anderson |         |
|-----------|---|---|---------|----------|---------|
| 3,141,714 | A |   | 7/1964  | Valitus  |         |
| 3,142,517 | A |   | 7/1964  | Ward     |         |
| 3,177,047 | A | * | 4/1965  | Mutchnik et al. | 312/308 |
| 3,292,985 | A |   | 12/1966 | Buhrmaster |       |
| 3,371,968 | A |   | 3/1968  | George   |         |
| 3,589,778 | A | * | 6/1971  | Olson    | 384/21  |
| 4,112,539 | A |   | 9/1978  | Hagen    |         |
| 4,549,773 | A |   | 10/1985 | Papp et al. |      |
| 4,560,212 | A |   | 12/1985 | Papp et al. |      |
| 4,749,242 | A |   | 6/1988  | Rechberg |         |
| 4,961,648 | A |   | 10/1990 | Rock     |         |
| 4,998,828 | A | * | 3/1991  | Hobbs    | 384/18  |
| 5,033,805 | A |   | 7/1991  | Hobbs    |         |
| 5,484,197 | A |   | 1/1996  | Hansen et al. |    |
| 5,571,256 | A |   | 11/1996 | Good et al. |      |
| 6,209,979 | B1|   | 4/2001  | Fall et al. |      |
| 6,296,338 | B1| * | 10/2001 | Stijns   | 312/333 |
| 6,390,574 | B2| * | 5/2002  | Fraccaro | 312/333 |

(Continued)

FOREIGN PATENT DOCUMENTS

GB 1 517 259 7/1978

*Primary Examiner* — Hanh V Tran
(74) *Attorney, Agent, or Firm* — Knobbe, Martens, Olson & Bear, LLP

(57) ABSTRACT

Slide assemblies that include at least an inner slide segment and an outer slide segment. Many of the slide assemblies also include an intermediate slide segment interposed between the inner slide segment and the outer slide segment. One or more of the segments can be constructed of an aluminum material and one or more of the segments can be constructed from a steel material. The inner slide segment includes a plurality of rollers separated into an upper row and a lower row. The inner slide segment also includes a plurality of keyholes separated into pairs, each of which includes an upper keyhole and a lower keyhole. The slide assembly can also include lock arrangements to secure individual slide segments in desired positions relative to one another. The slide assemblies preferably have a narrow cross-sectional width and a relatively high static and operational load rating.

18 Claims, 11 Drawing Sheets

(56) References Cited

U.S. PATENT DOCUMENTS

| | | | |
|---|---|---|---|
| 6,422,399 B1 | 7/2002 | Castillo et al. | |
| 6,601,933 B1 * | 8/2003 | Greenwald | 312/333 |
| 6,609,619 B2 | 8/2003 | Abbott | |
| 6,702,412 B2 | 3/2004 | Dobler et al. | |
| 6,749,275 B2 | 6/2004 | Cutler et al. | |
| 6,773,080 B2 | 8/2004 | Chen et al. | |
| 6,805,418 B2 * | 10/2004 | Milligan | 312/333 |
| 6,830,300 B2 | 12/2004 | Lauchner | |
| 6,851,773 B2 | 2/2005 | Chen et al. | |
| 6,860,575 B2 | 3/2005 | Chen et al. | |
| 6,883,884 B2 | 4/2005 | Chen et al. | |
| 6,935,710 B2 | 8/2005 | Chen et al. | |
| 6,962,397 B2 | 11/2005 | Dobler et al. | |
| 6,976,745 B2 | 12/2005 | Dobler et al. | |
| 6,979,067 B2 * | 12/2005 | Yang | 312/334.46 |
| 7,134,802 B2 | 11/2006 | Doerr et al. | |
| 7,281,694 B2 | 10/2007 | Allen et al. | |
| 7,303,361 B1 | 12/2007 | Lane | |
| 7,318,532 B1 | 1/2008 | Lee et al. | |
| 7,357,362 B2 | 4/2008 | Yang et al. | |
| 7,364,244 B2 | 4/2008 | Sandoval | |
| 7,404,611 B1 * | 7/2008 | Que | 312/334.46 |
| 7,552,899 B2 | 6/2009 | Chen et al. | |
| 7,604,307 B2 * | 10/2009 | Greenwald et al. | 312/333 |
| 7,604,308 B2 | 10/2009 | Tseng et al. | |
| 7,628,460 B1 * | 12/2009 | Huang | 312/333 |
| 7,641,297 B2 | 1/2010 | Huang | |
| 7,658,457 B2 * | 2/2010 | Lu | 312/334.47 |
| 7,731,142 B2 | 6/2010 | Chen et al. | |
| 7,794,030 B2 * | 9/2010 | Peng et al. | 312/334.46 |
| 7,794,031 B2 * | 9/2010 | Hsiung et al. | 312/334.46 |
| 7,798,582 B2 | 9/2010 | Yu et al. | |
| 7,857,403 B2 * | 12/2010 | Chen et al. | 312/334.46 |
| 7,896,452 B2 * | 3/2011 | Chang | 312/333 |
| 7,967,399 B1 | 6/2011 | Baiza et al. | |
| 7,992,950 B2 | 8/2011 | Lauchner | |
| 8,231,188 B1 * | 7/2012 | Chen et al. | 312/333 |
| 8,272,783 B2 | 9/2012 | Mochizuki et al. | |
| 8,317,278 B2 | 11/2012 | Enos | |
| 8,353,494 B2 | 1/2013 | Peng et al. | |
| 8,371,454 B2 | 2/2013 | Chen et al. | |
| 8,403,432 B2 | 3/2013 | Chen et al. | |
| 8,534,782 B2 * | 9/2013 | Yu et al. | 312/333 |
| 8,585,166 B2 * | 11/2013 | Chen et al. | 312/334.46 |
| 8,632,141 B2 * | 1/2014 | Park et al. | 312/333 |
| 8,662,607 B2 * | 3/2014 | Fan et al. | 312/333 |
| 8,672,431 B2 * | 3/2014 | Chen et al. | 312/334.46 |
| 2001/0017760 A1 | 8/2001 | Baertsoen | |
| 2001/0035704 A1 | 11/2001 | Dierbeck | |
| 2001/0040203 A1 | 11/2001 | Brock et al. | |
| 2002/0153815 A1 * | 10/2002 | Chaloner et al. | 312/333 |
| 2002/0158556 A1 * | 10/2002 | Cheng | 312/333 |
| 2003/0062812 A1 * | 4/2003 | Hwang et al. | 312/334.34 |
| 2003/0111942 A1 * | 6/2003 | Judge et al. | 312/334.46 |
| 2004/0056572 A1 | 3/2004 | Chen et al. | |
| 2005/0006996 A1 * | 1/2005 | Milligan | 312/334.46 |
| 2005/0052102 A1 * | 3/2005 | Lauchner | 312/334.5 |
| 2005/0062379 A1 * | 3/2005 | Judge et al. | 312/334.46 |
| 2005/0206284 A1 * | 9/2005 | Dubon et al. | 312/333 |
| 2006/0091769 A1 * | 5/2006 | Dubon | 312/333 |
| 2006/0152115 A1 | 7/2006 | Dubon et al. | |
| 2006/0284531 A1 * | 12/2006 | Dubon | 312/333 |
| 2007/0040485 A1 * | 2/2007 | Tseng et al. | 312/333 |
| 2007/0164644 A1 * | 7/2007 | Hwang et al. | 312/333 |
| 2008/0012456 A1 * | 1/2008 | Judge et al. | 312/334.1 |
| 2008/0122333 A1 | 5/2008 | Tseng et al. | |
| 2008/0218047 A1 * | 9/2008 | Buczynski et al. | 312/334.12 |
| 2008/0278048 A1 * | 11/2008 | Burgess, III | 312/333 |
| 2009/0072689 A1 * | 3/2009 | Yang et al. | 312/333 |
| 2009/0169140 A1 * | 7/2009 | Chen et al. | 384/21 |
| 2010/0176700 A1 * | 7/2010 | Perez et al. | 312/334.8 |
| 2010/0265651 A1 * | 10/2010 | Huang et al. | 361/679.39 |
| 2011/0100935 A1 * | 5/2011 | Yang | 211/26 |
| 2012/0043872 A1 * | 2/2012 | Enos | 312/332.1 |
| 2012/0057812 A1 * | 3/2012 | Judge et al. | 384/40 |
| 2012/0093445 A1 * | 4/2012 | Haxton | 384/21 |
| 2012/0262041 A1 * | 10/2012 | Zhang et al. | 312/319.1 |

* cited by examiner

SLIDE ASSEMBLY

RELATED APPLICATIONS

Related applications are listed on an Application Data Sheet (ADS) filed with this application. The entirety of each application listed on the ADS is hereby incorporated by reference herein and made a part of the present specification.

BACKGROUND OF THE INVENTION

1. Field of the Invention

The present invention generally relates to slide assemblies. In particular, the present invention relates to slide assemblies having a high ratio of load capacity to cross-sectional size.

2. Description of the Related Art

Slide assemblies are often used to support a computer server within an enclosure or rack. The slide assembly permits the server to be extended from the rack to promote access to the server for maintenance, replacement or the like. The server enclosure or rack typically includes a vertical support rails at each corner. A pair of slide assemblies are mounted to the vertical support rails on opposing sides of the enclosure. The pair of slide assemblies movably support opposing sides of a computer server.

The vertical support rails of the server rack typically include a plurality of openings, or mounting holes, spaced along the height of the support rail, which permit the slide assemblies to be coupled to the vertical support rails at any of a number of possible locations. Typically, a bracket will be connected to each end of the slide assembly and act as an interface between the slide assembly and the vertical support rails of the rack.

Although slide assemblies have been in use for a significant period of time, there is a demand for continued improvement in the design and operation of slide assemblies, especially in slide assemblies intended for use in computer server or other electronic equipment applications. For example, there is a constant push to reduce the cross-sectional size of the slide assemblies, while retaining functionality (including load-carrying capacity) or even improving the functionality of the slide assemblies.

SUMMARY OF THE INVENTION

A preferred embodiment involves a slide assembly, which includes a mounting arrangement that permits the slide assembly to be mounted to a supporting structure. The mounting arrangement includes a first bracket and a second bracket, wherein a position of at least one of the first bracket and the second bracket is adjustable in a longitudinal direction of the slide assembly to permit a length adjustment of the mounting arrangement. The slide assembly includes an outer slide segment, at least one intermediate slide segment and an inner slide segment. The outer slide segment has a first bearing surface and a second bearing surface. The at least one intermediate slide segment is telescopically engaged with the outer slide segment. The at least one intermediate slide segment has a first bearing surface and a second bearing surface. The first and second bearing surfaces of each of the outer slide segment and the at least one intermediate slide segment transfer a load applied to the slide assembly between the outer slide segment and the at least one intermediate slide segment. The inner slide segment is telescopically engaged with the at least one intermediate slide segment. The inner slide segment includes a plurality of rollers separated into an upper row and a lower row. The plurality of rollers contact the intermediate slide segment to transfer the load applied to the slide assembly between the inner slide segment and the intermediate slide segment. A plurality of keyholes is defined by the inner slide segment. In use, the keyholes receive mounting pins of an object supported by the slide assembly. The plurality of keyholes comprises keyhole pairs, each of which include an upper keyhole and a lower keyhole spaced from one another. A first lock secures the intermediate slide segment in an open position relative to the outer slide segment. The first lock comprises a spring lock arm secured to the outer slide segment and that extends through an opening in the outer slide segment to engage the intermediate slide segment. The inner slide segment contacts the spring lock arm to disengage the spring lock arm from the intermediate slide segment. A second lock secures the inner slide segment in an open position relative to the intermediate slide segment. The second lock comprises a latch that engages an opening in a flange portion of the intermediate slide segment. The latch comprises a hook and a protrusion. The hook passes through the opening in the flange portion and the protrusion is positioned forward of the intermediate slide segment. At least one of the slide segments is constructed from an aluminum material and at least one of the slide segment is constructed from a steel material.

In some configurations, the outer slide segment and the at least one intermediate slide segment are made from 6061, 7075 or another suitable aluminum material. The inner slide segment can be constructed from a steel material.

In some configurations, the inner slide segment is shaped by a roll forming process.

In some configurations, the mounting arrangement comprises a plurality of pins carried by each of the first bracket and the second bracket, wherein each of the pins are cylindrical in shape and include a central through-hole. The first bracket can be positioned at a forward end of the outer slide segment and includes four pins and the second bracket can be positioned at a rearward end of the outer slide segment and includes two pins.

In some configurations, a pin retention latch is associated with one of the plurality of keyholes and which prevents removal of a pin received in the associated keyhole.

A preferred embodiment involves a slide assembly, which includes a mounting arrangement that permits the slide assembly to be mounted to a supporting structure. The mounting arrangement comprising a first bracket at a forward end of the slide assembly and a second bracket at a rearward end of the slide assembly. A position of the second bracket is adjustable in a longitudinal direction of the slide assembly to permit a length adjustment of the mounting arrangement. An outer slide segment has a first bearing surface and a second bearing surface. At least one intermediate slide segment is telescopically engaged with the outer slide segment. The at least one intermediate slide segment has a first bearing surface and a second bearing surface, wherein the first and second bearing surfaces of each of the outer slide segment and the at least one intermediate slide segment transfer a load applied to the slide assembly between the outer slide segment and the at least one intermediate slide segment. An inner slide segment is telescopically engaged with the at least one intermediate slide segment. The inner slide segment includes a plurality of rollers separated into an upper row and a lower row. The plurality of rollers contact the intermediate slide segment to transfer the load applied to the slide assembly between the inner slide segment and the intermediate slide segment. A plurality of keyholes is defined by the inner slide segment, wherein, in use, the keyholes receive mounting pins of an object supported by the slide assembly. The plurality of keyholes comprises keyhole pairs, each of which includes an upper keyhole and a lower keyhole spaced from one another. At least one of the slide segments is constructed from an aluminum material and at least one of the slide segments is constructed from a steel material.

In some configurations, the outer slide segment and the at least one intermediate slide segment are made from 6061, 7075 or another suitable aluminum material. The inner slide segment can be constructed from a steel material. The inner slide segment can be shaped by a roll forming process.

In some configurations, the mounting arrangement comprises a plurality of pins carried by each of the first bracket and the second bracket, wherein each of the pins are cylindrical in shape and include a central through-hole. The first bracket can include four pins and the second bracket includes two pins.

In some configurations, a pin retention latch is associated with one of the plurality of keyholes and which prevents removal of a pin received in the associated keyhole.

BRIEF DESCRIPTION OF THE DRAWINGS

These and other features, aspects and advantages of the present slide assemblies are described herein with reference to drawings of certain preferred embodiments, which are provided for the purpose of illustration and not limitation. The drawings contain ten (10) figures.

DETAILED DESCRIPTION OF THE PREFERRED EMBODIMENTS

Figure 1:
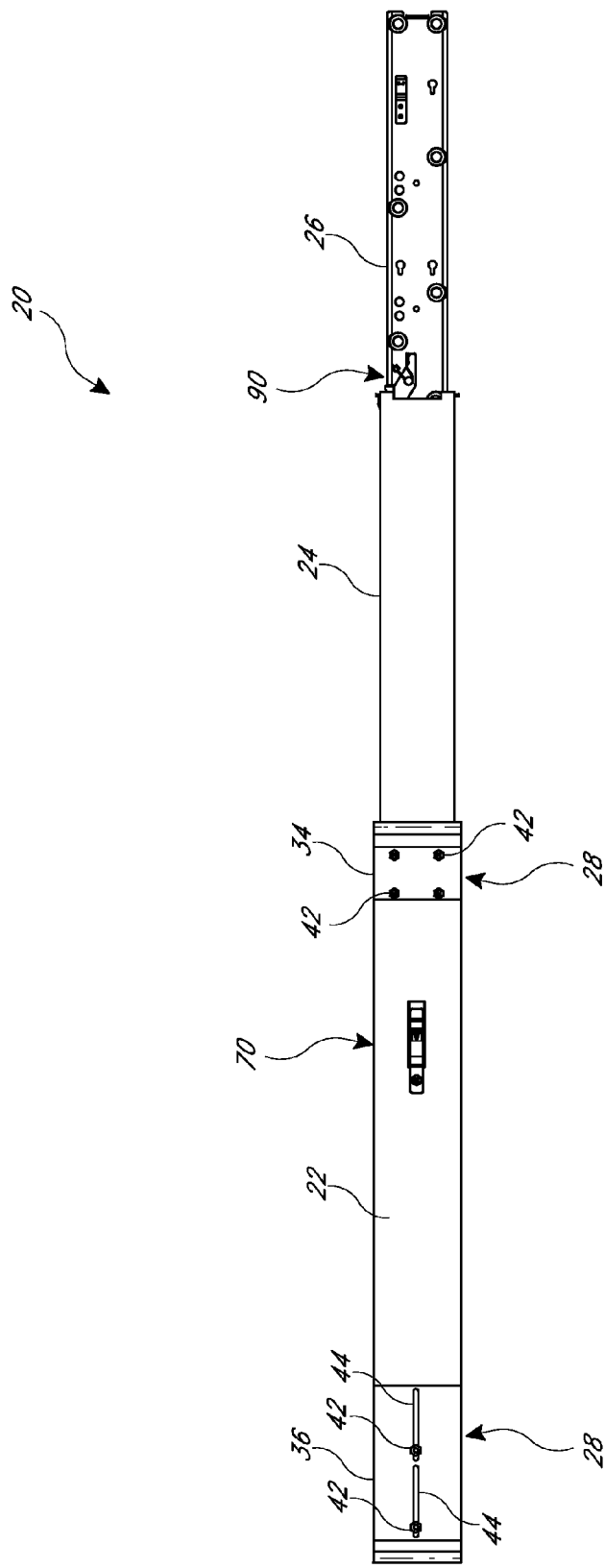
FIG. 1 is a side view of a first or outboard side of a slide assembly in an open position.

Preferred embodiments of the compact slide assemblies include between two and four (or possibly more) slide segments telescopically engaged with one another to move between a closed position and an open position. The slide segments may also be referred to as channels herein. However, the use of the term "channel" does not imply any particular cross-sectional shape. The segments or channels may be any suitable shape to permit telescopic engagement between the segments. Certain preferred cross-sectional shapes are illustrated and/or described herein. Typically, one or more slide assemblies permit one object to be supported and moved relative to another object. One object is often stationary, such as an enclosure or rack, and the other object, such as a drawer or an electronic component (e.g., a computer server), is movable between an open and closed position relative to the stationary object. Often, a slide assembly is provided on each side of the supported object. For convenience, the slide assembly is referred to as having an outboard side and an inboard side. The outboard side typically faces outwardly from the supported object and the inboard side faces toward the supported object. Also, the slide assembly is referred to as having a forward end and a rearward end. The slide assembly opens from the forward end and moves away from the rearward end. These, and other relative terms (top, bottom, above, below, etc.) are used for convenience and with respect to the particular orientation shown in the referenced figures and are not intended to be limiting, unless otherwise indicated or made clear from the particular context. Thus, the slide assemblies can also be used in other orientations, or adapted for use in orientations other than those illustrated.

The preferred embodiments disclosed herein are well-suited for use in movably supporting computer servers relative to a server rack. In particular, the preferred slide assemblies have a relatively small cross-sectional size such that the space available for the computer server can be maximized. For example, in some embodiments, the cross-sectional width of the slide assembly is less than 0.4 inches and, preferably, is about 0.349 inches (or any value within the range between these two values). In addition, the slide assemblies are capable of supporting the load applied by the servers, and often additional loading, while still maintaining smooth extension and retraction of the slide assembly. For example, in some embodiments (including an embodiment having a width of about 0.349 inches), the slide assembly can accommodate a static load of about 500 lbs. in an open position and, thereafter, is functional with a cyclic working load of up to about 200 lbs. Such an overload capability is highly advantageous because in normal use such slide assemblies often encounter a load beyond the normal operational or cyclic working load rating. Accordingly, preferred embodiments can remain functional after experiencing static loads well beyond the operational load rating. Furthermore, preferably, the slide assemblies can be manufactured in a cost-effective manner. As discussed further below, in some arrangements, the slide assembly is a hybrid including one or more aluminum segments and one or more steel segments. Some embodiments can support a load of at least about 400-500 pounds with the slide assembly in an open position.

FIGS. 1-10 illustrate a compact slide assembly 20 having certain features, aspects and advantages of the preferred embodiments. In the illustrated arrangement, the slide assembly 20 includes three slide segments: an outer slide segment 22, an intermediate slide segment 24 and an inner slide segment 26 telescopically engaged with one another and movable between a closed position and an open position. However, in other arrangements, the slide assembly 20 may include only two segments, or more than three segments. In some configurations, the slide assembly 20 can include one or more locking mechanisms that permit the slide assembly 20 to be selectively locked in one or more of a closed position, an open position, and a partially open or closed position, among others. In addition, the slide assembly 20 may include bearings or rollers interposed between the slide segments 22, 24, 26 to facilitate smooth relative movement therebetween.

The slide assembly 20 is configured to be secured to a stationary object, which can be a computer server rack, for example. Typically, the computer server rack includes vertical mounting rails at each corner. The slide assembly 20 includes a mounting arrangement 28 that permits the slide assembly 20 to be secured to the mounting rails of a server rack. Preferably, the mounting arrangement 28 is attached to the outer slide segment 22 such that the outer slide segment 22 is connected to the server rack and the inner slide segment 26 carries the computer server. However, in other arrangements, the inner segment may be connected to the stationary object and the outer slide segment may be connected to the movable object. Moreover, the slide assembly 20 may be connected to the server rack in any suitable manner, including tool-less attachment or attachments utilizing fasteners that require tools to assemble or disassemble.

The illustrated mounting arrangement 28 not only permits the slide assembly 20 to be coupled to the server rack, but also provides some amount of length adjustment such that the mounting arrangement 28 can accommodate server racks that vary in depth. In particular, the mounting arrangement 28 includes a first coupling or bracket 34 and a second coupling or bracket 36. One or both of the first bracket 34 and the second bracket 36 are adjustable relative to the slide assembly 20 such that the overall length defined by the first bracket 34 and second bracket 36 can be adjusted. In the illustrated arrangement, the second bracket 36 is adjustable relative to the outer slide segment 22. However, in other embodiments, this arrangement could be reversed or both brackets 34 and 36 could be adjustable.

In the illustrated arrangement, the first bracket 34 is positioned at a first or forward end and the second bracket 36 at a second or rearward end of the slide assembly 20, in general, and the outer slide segment 22, in particular. Each of the illustrated brackets 34, 36 include one or more nuts 40. The nut can be a press-nut or press-in nut, in which the nut is secured to the slide segment in a press-fit manner. Preferably, four press-in nuts 40 are provided on the forward bracket 34 and two press-in nuts 40 are provided on the rearward bracket 36; however, other numbers of press-in nuts 40 are also possible. The press-in nuts 40 are configured to threadably receive threaded fasteners (e.g., screws or bolts) that engage mounting holes in the vertical rails of the computer server rack. The illustrated press-in nuts 40 are generally cylindrical in shape and include a threaded central through-hole. However, other suitable shapes may also be used. In addition, other types of mounting structures can be provided, such as mounting pins that directly engage the mounting holes of the server rack. The pin number and/or shape may be configured to match the shape of the server rack mounting holes or may simply be configured to be capable of engagement with the mounting holes (e.g., circular pin in a rectangular hole). If desired, each of the brackets 34, 36 could also include a latch that secures the bracket 34, 36 to the server rack. The optional latch can be pivotally coupled to the bracket to rotate about a pivot axis and can be biased to a closed or locked position under the urging of a biasing member.

The mounting arrangement 28 may be secured to the slide outer slide segment 22 (or other portion of the slide assembly 20) by any suitable arrangement. In the illustrated arrangement, each bracket 34, 36 of the mounting arrangement 28 is secured to the outer slide segment 22 by a plurality of fastener assemblies 42, such as bolt-and-nut assemblies 42. However, other suitable fasteners, such as or rivets, may be used to secure the mounting arrangement 28 to the outer slide segment 22.

In the illustrated arrangement, the forward bracket 34 includes four bolt-and-nut assemblies 42 that secure the bracket 34 to the outer slide segment 22 in a fixed position. The rearward bracket 36 includes two bolt-and-nut assemblies 42 that secure the bracket 36 to the outer slide segment 22. However, the rearward bracket 36 includes a slot 44 for each bolt-and-nut assembly 42 such that the position of the rearward bracket 36 in at least a longitudinal direction can be adjusted relative to the outer slide segment 22. In the illustrated arrangement, the slots 44 extend in a longitudinal direction of the slide assembly 20 and are aligned with one another generally along a vertical center line of the slide assembly 20.

Figure 4:
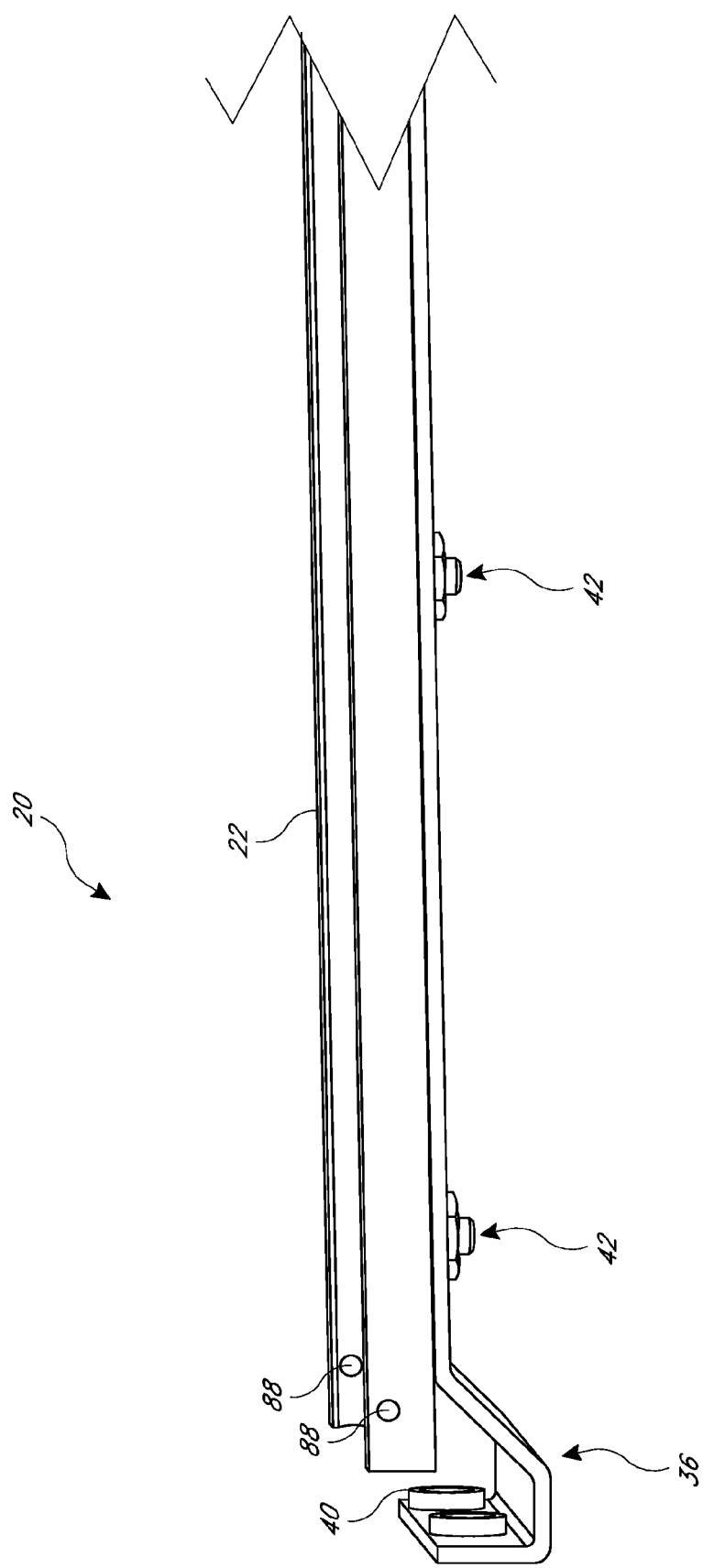
FIG. 4 is a top perspective view of a rearward portion of the slide assembly of FIG. 1.
Figure 5:
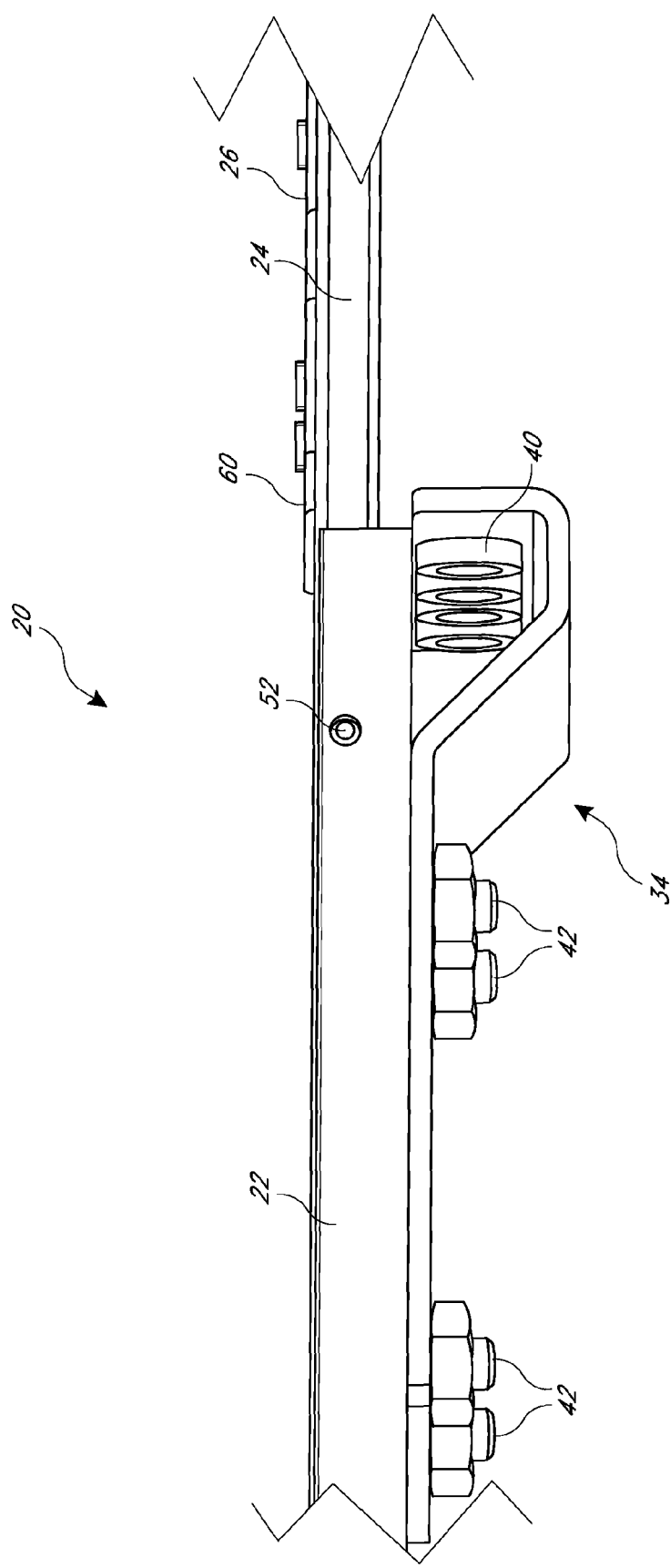
FIG. 5 a top perspective view of an intermediate portion of the slide assembly of FIG. 1, which shows a forward portion of an outer slide segment of the slide assembly.

With reference to FIGS. 4 and 5, each bracket 34 and 36 includes a flat or planar portion that is coupled to the outer slide segment 22 and a generally U-shaped portion that supports the press-in nuts 40. Preferably, the press-in nuts 40 extend inwardly from an outermost side leg of the U-shaped portion, such that, in use, the outermost side leg of the U-shaped portion is positioned inside (i.e., rearwardly or forwardly) of the respective forward and rearward mounting rail of the server rack and the associated threaded fasteners extend through the mounting holes in the mounting rails and into the press-in nuts 40. In an alternative embodiment in which the brackets 34 and 36 directly engage the mounting holes, the U-shaped portion could generally surround three sides of the mounting rail.

Preferably, the intermediate slide segment 24 is supported for movement relative to the outer slide segment 22 by a plurality of bearings and, in particular, ball bearings 50. In the illustrated arrangement, the ball bearings 50 are loosely carried between the bearing surfaces of the outer slide segment 22 and intermediate slide segment 24. A forward stop 52 and a rearward stop 54 inhibit the ball bearings 50 from exiting the space between the bearing surfaces of the segments 22, 24. In the illustrated arrangement, the stops 52, 54 are pins. The forward pin 52 is secured to the forward end of the outer slide segment 22 and the rearward pin 54 is secured to the rearward end of the intermediate slide segment 24. Each pin 52 and 54 extend into the bearing space between bearing surfaces of the segments 22 and 24 in which the ball bearings 50 are located. However, in other preferred embodiments, the stops 52, 54 could be of any other suitable construction, such as integrated tabs punched from the body of the segment 22 or 24 and deformed into the path of the ball bearings 50.

Preferably, the inner slide segment 26 is supported for movement relative to the intermediate slide segment 24 by a plurality of rollers 60. Each of the rollers 60 includes an axle or hub 62 that is fixedly supported within an opening in a web portion of the inner slide segment 26. A roller portion 64 is rotatably supported on the hub 62. An upper or lower portion of each roller portion 64 extends through a corresponding window or opening 66 in the flange portion of the inner slide segment 26 such that the roller portion 64 can contact the bearing surface of the intermediate slide segment 24. Preferably, at least the roller portions 64 are constructed of a nylon material for low rolling resistance and durability. In some arrangements, both the hub 62 and the roller portion 64 can be a plastic material, such as nylon, for example and without limitation. In some arrangements, the hub 62 is constructed from a metal material, such as steel or brass, for example but without limitation.

In the illustrated configuration, the rollers 60 are separated into an upper row 60a and a lower row 60b. The upper row 60a extends through openings 66 in the upper flange portion of the inner slide segment 26 and contacts the upper bearing surface of the intermediate slide segment 24. Similarly, the lower row 60b extends through openings 66 in the lower flange portion of the inner slide segment 26 and contacts the lower bearing surface of the intermediate slide segment 24. The forward-most upper and lower rollers 60 are aligned with one another in a vertical direction. Preferably, the forward-most upper and lower rollers 60 are positioned at or near the forward end of the inner slide segment 26. Similarly, the rearward-most upper and lower rollers 60 are aligned in a vertical direction and, preferably, positioned at or near the rearward end of the inner slide segment 26.

Figure 2:
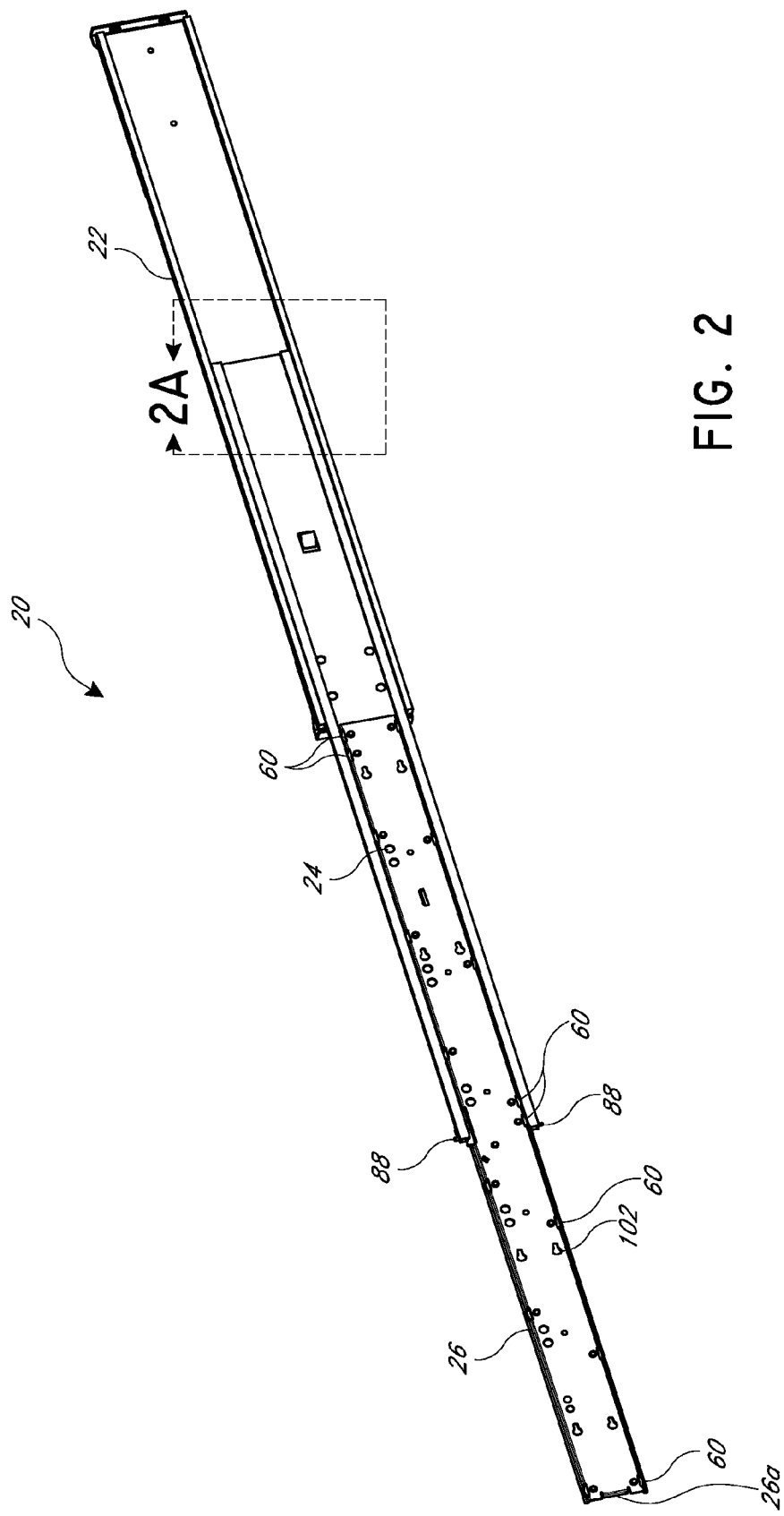
FIG. 2 is a side view of a second or inboard side of the slide assembly of FIG. 1 in an open position.
Figure 2A:
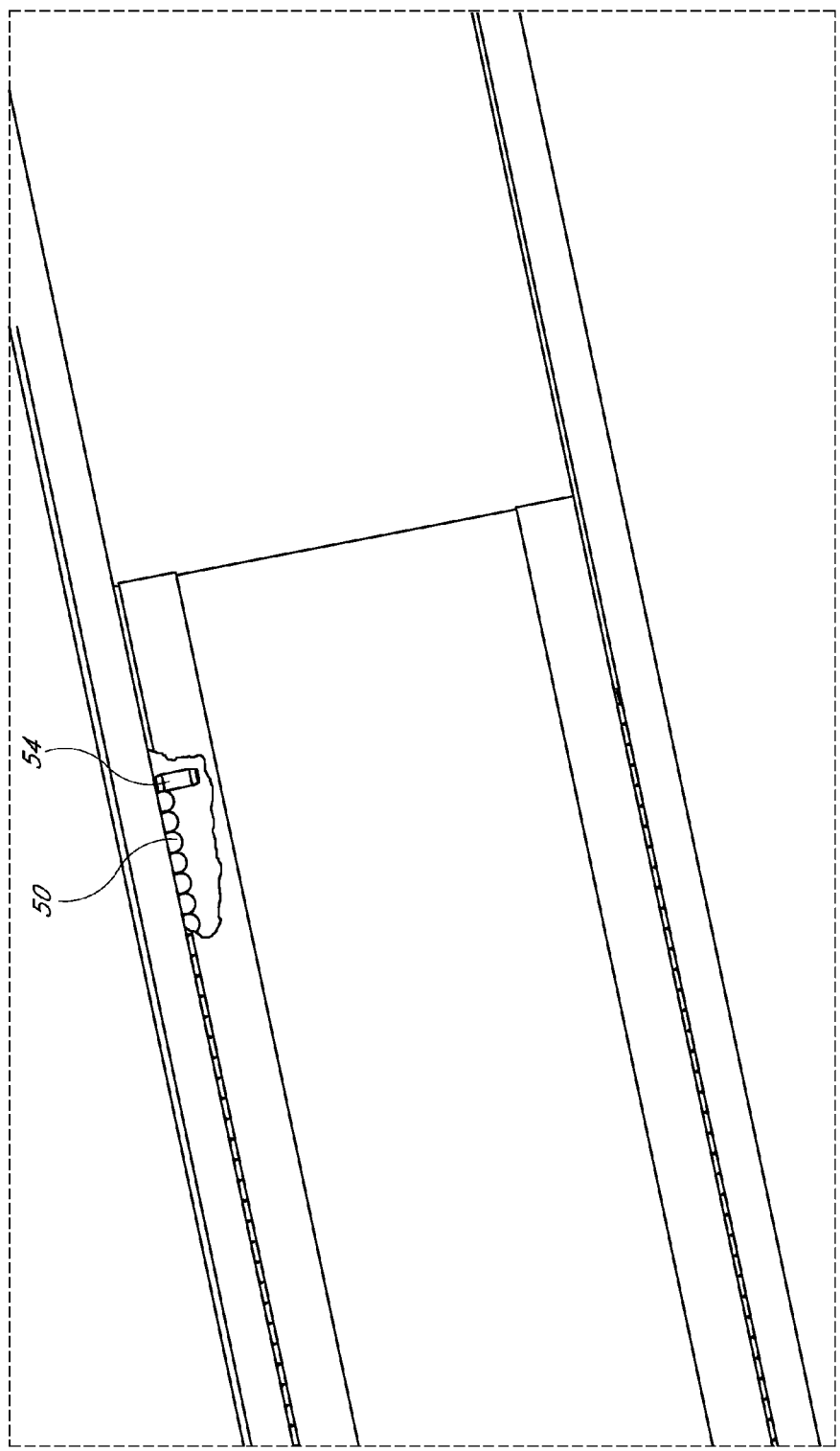
FIG. 2a is an enlarged view of a portion of the slide assembly shown in FIG. 2.
Figure 3:
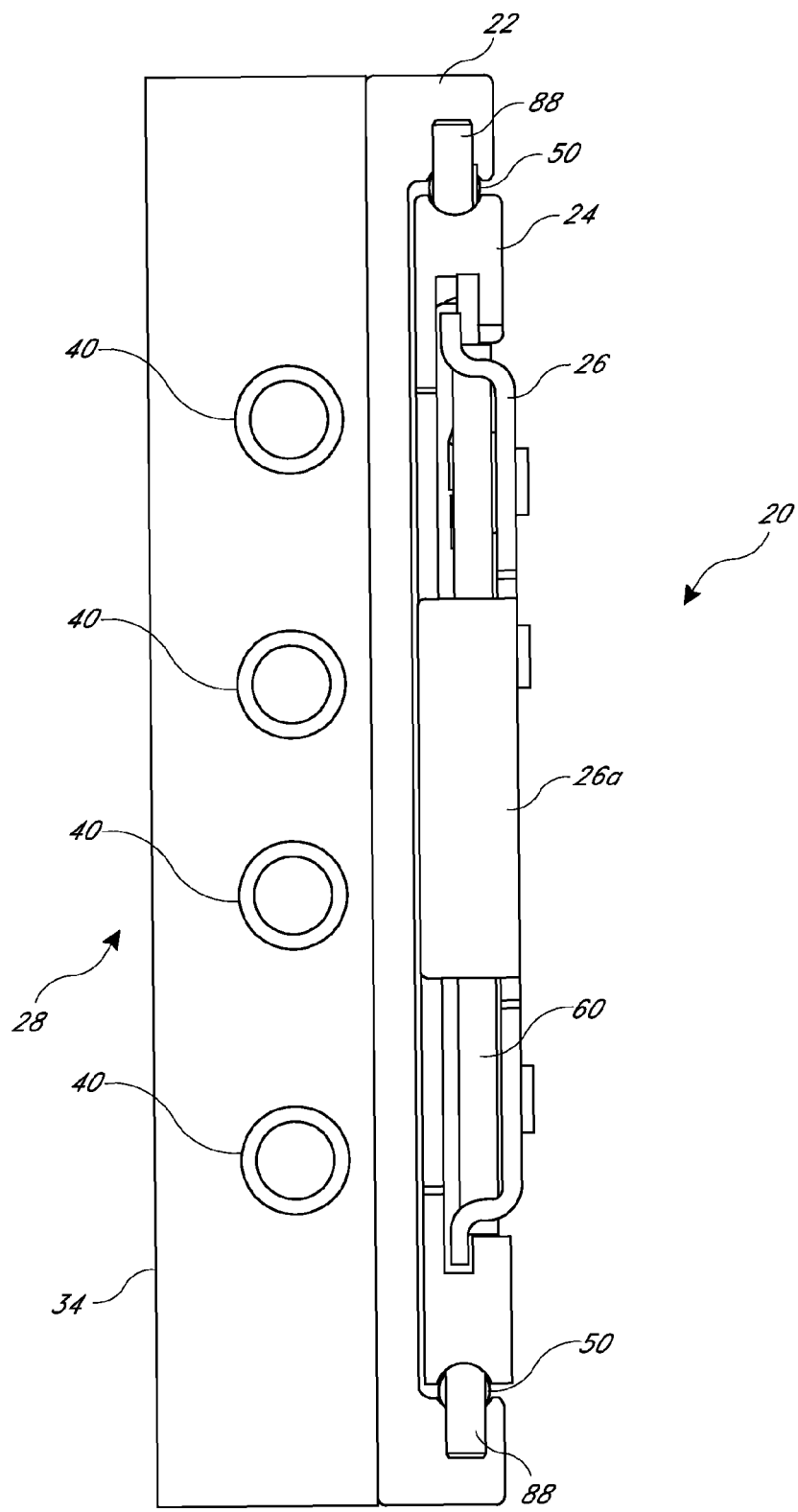
FIG. 3 is a front view of the slide assembly of FIG. 1.

The intermediate upper and lower rollers 60 preferably are offset from one another in a vertical direction. In the illustrated arrangement, the lower intermediate rollers 60 are offset in a forward direction relative to the upper intermediate rollers 60. With reference to FIG. 2, preferably, a pair of rollers 60 is provided at the upper, rearward end of the inner slide segment 26 and another pair of rollers 60 is provided at the location of the inner slide segment 26 located at the lower, forward end of the intermediate slide segment 24. With such an arrangement, the pairs of rollers 60 are located at the highest load areas of the slide assembly 20 in the open position. Although loose ball bearings 50 and rollers 60 are illustrated, other suitable mechanisms may be used to allow smooth movement between the individual segments 22, 24, 26, including solid bearing surfaces.

Figure 10:
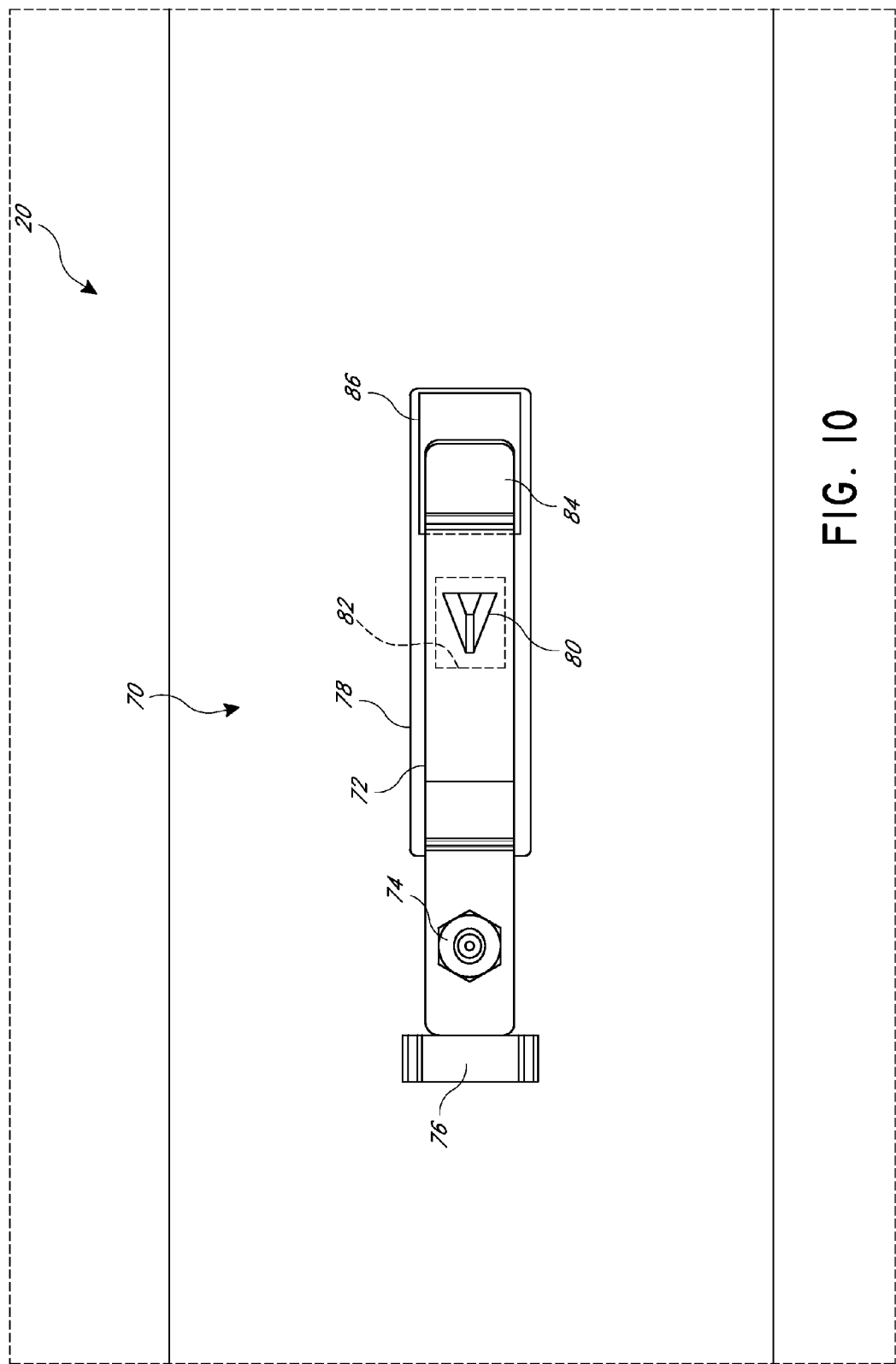
FIG. 10 is an enlarged, outboard side view of a portion of the slide assembly of FIG. 1, which shows a lock arrangement that secures the intermediate slide segment into an open position relative to the outer slide segment.

The slide assembly 20 may include multiple locks, which operate to secure segments in desirable positions relative to one another and release the segments at a desirable time during cycling of the slide assembly 20. With reference to FIGS. 1 and 10, a first lock arrangement 70 secures the intermediate segment 24 in an open position relative to the outer segment 22. The first lock 70 includes a lock-arm or latch 72 that is secured to the outer slide segment 22, preferably by a fastener, such as a bolt-and-nut assembly 74. A stop surface defined by a protrusion 76 of the outer slide segment 22 contacts the latch 72 and inhibits the latch 72 from rotating about an axis of the bolt-and-nut assembly 74, such that only a single bolt-and-nut assembly 74 (or other fastener) is required.

The latch 72 is coupled to the outboard side of the outer slide segment 22 and extends through an opening 78 in the outer slide segment 22 toward the intermediate slide segment 24. The latch 72 preferably is a spring-arm that is biased toward the intermediate slide segment 24. An engagement portion 80 of the latch 72 engages an opening 82 in the intermediate slide segment 24 when the intermediate slide segment 24 reaches an open position relative to the outer slide segment 22 to secure the intermediate slide segment 24 in the open position. The illustrated engagement portion 80 is a generally triangular-shaped protrusion created from the material of the latch 72. The latch 72 also includes a release portion 84 that is angled relative to the remainder of the latch 72 and extends through an opening 86 in the intermediate slide segment 24 toward the inner slide segment 26. The release portion 84 is contacted by the inner slide segment 26 when sufficiently closed relative to the intermediate slide segment 24. As a result of the angled orientation of the release portion 84, as the inner slide segment 26 moves along the release portion 84, the latch 72 is deflected such that the engagement portion 80 is moved out of engagement with the opening 82 thereby releasing the intermediate slide segment 24 to move toward the closed position relative to the intermediate slide segment 24. The intermediate slide segment 24 is then able to close relative to the outer slide segment 22. Rearward travel of the intermediate slide segment 24 within the outer slide segment 22 is limited by a stop, such as a pair of pins 88 carried by a forward end of the intermediate slide segment 24 and/or a pair of pins 88 carried by the rearward end of the outer slide segment 22.

The slide assembly 20 also includes a second lock arrangement 90 that operates to selectively secure the inner slide segment 26 in an open position relative to the intermediate slide segment 24 and prevents movement in at least one direction from the open position. In the illustrated arrangement, the second lock 90 prevents or inhibits movement in both directions from the open position. In other words, the second lock 90 prevents removal of the inner slide segment 26 from the intermediate slide segment 24. In addition, closing of the inner slide segment 26 is inhibit or prevented until the second lock 90 is released. The second lock 90 preferably includes a latch 92 that is pivotally secured to the inner slide segment 26. A support shaft or pin 94 is fixedly secured to the inner slide segment 26 and rotatably supports the latch 92, which is biased to rotate about the pin 94 by a biasing member, such as a spring 96. The spring 96 biases a hook portion 98 of the latch 92 into engagement with an opening 100 in the intermediate slide segment 24 and, preferably, into engagement with an end surface of the intermediate slide segment 24 such that the inner slide segment 26 is secured, or locked, into an open position and inhibited or prevented from removal or closing until the latch 92 is released.

Preferably, the hook portion 98 defines a hook 98a and a protrusion 98b. The hook 98a extends in a forward direction of the slide assembly 20 and passes through the opening 100 of the intermediate slide segment 24. The protrusion 98b is positioned forwardly of the hook 98a and is positioned forward of the intermediate slide segment 24 when the hook 98a is positioned in the opening 100. The hook 98a prevents the inner slide segment 26 from being separated or removed from the intermediate slide segment 24 until the latch 92 is released, such as by manual rotation of the latch 92 against the biasing force of the spring 96 until the hook 98a is released from the opening 100, thereby permitting the inner slide segment 26 to be removed. However, the rearward facing surface of the hook 98a is curved such that closing movement of the inner slide segment 26 is not prevented or substantially inhibited by the hook 98a. The protrusion 98b can contact the forward end of the inner slide segment 26 to inhibit or prevent closure of the inner slide segment 26 until the latch 92 is released. However, the rearward facing surface of the protrusion 98b is rounded such that the protrusion can simply inhibit closure of the inner slide segment 26, but can permit closure in response to sufficient force acting on the inner slide segment 26. Therefore, the protrusion 98b can create a "detent" for the open position of the inner slide segment 26, rather than a positive lock open. In addition, the rounded shape of the protrusion 98b can assist in the automatic rotation of the latch 92 toward an unlocked or unblocked position in response to rearward movement of the inner slide segment 26, once movement of the inner slide segment has begun. In addition, the forward end (or other portion) of the protrusion 98b can contact the flange portion (or other portion) of the inner slide segment 26 to define the normal position of the latch 92. Other suitable shapes of the hook 98a and protrusion 98b (including the presence or absence of either) can be provided depending on the desired detent or locking function. The forward end of the inner slide segment 26 can define a tab 26a, which contacts the forward end of the intermediate slide segment 24 to define a closed position of the inner slide segment 26 relative to the intermediate slide segment 24.

Although two lock arrangements are disclosed herein and referred to as first and second locks, it is not required nor implied that both lock arrangements are necessarily present in any particular embodiment. Rather, one or both of the lock arrangements may be used depending on the particular application and the desired operational sequence of the slide assembly. Moreover, additional lock arrangements may also be provided. In addition, the use of the term "lock" herein can also include structures that provide a "detent" function, unless otherwise indicated or made clear from the specific context.

Preferably, the inner slide segment 26 is configured to support an object. As described above, in one arrangement, the slide segment 26 is configured to support a computer server. In the illustrated arrangement, the inner slide segment 26 includes a plurality of keyholes 102, which receive rivets or pins provided on the computer server (not shown). The pins include a head portion and a smaller shaft portion. The large opening of the keyhole 102 is configured to allow the head portion of the pin to pass and the slot of the keyhole 102 receives the shaft portion of the pin. Preferably, multiple (e.g., two, three, four, five or more) keyholes 102 are provided. Desirably, at least as many keyholes 102 are provided as pins present on the object with which the slide assembly 20 is intended for use. In the illustrated arrangement, at least some of the keyholes 102 are provided in pairs that are aligned with one another in a longitudinal direction. Each pair includes an upper keyhole 102 and a lower keyhole 102. Preferably, each of the keyholes 102 is provided in a pair and four pairs are provided. In the illustrated arrangement, two pairs are provided toward the front of the inner slide segment 26 and two pairs are provided toward the rear of the inner slide segment 26 with the distance between the forward two pairs and the rearward two pairs being greater than the space between the two pairs making up either the forward pairs or the rearward pairs.

Figure 6:
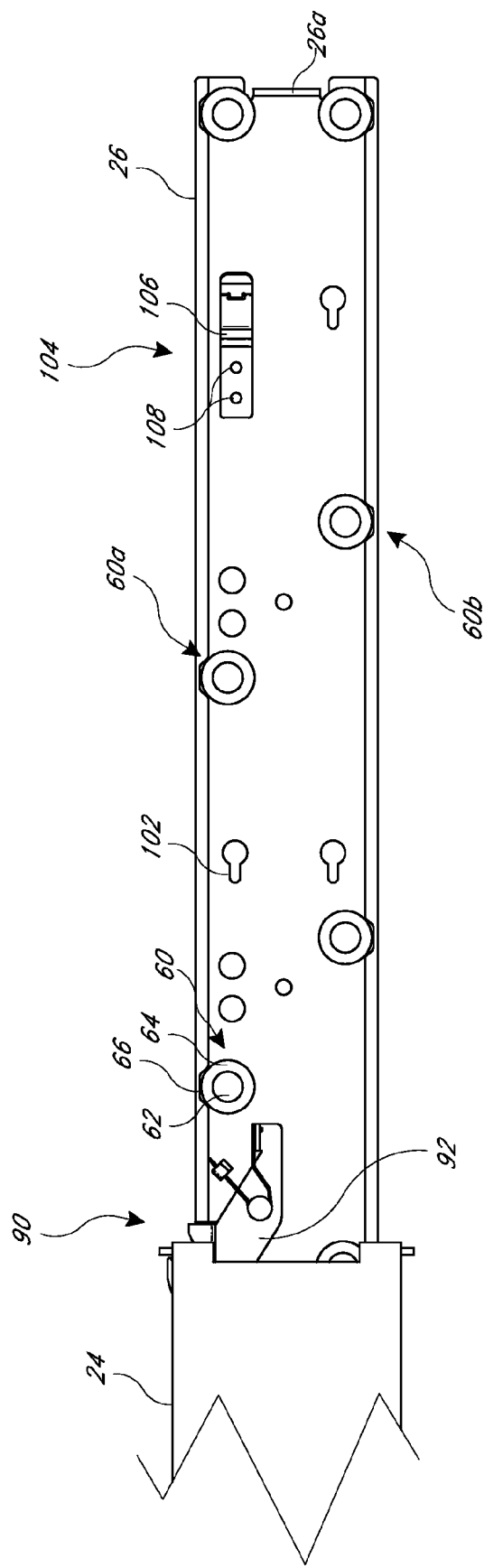
FIG. 6 is a side view of a forward portion of the slide assembly of FIG. 1, which shows an inner slide segment of the slide assembly.
Figure 7:
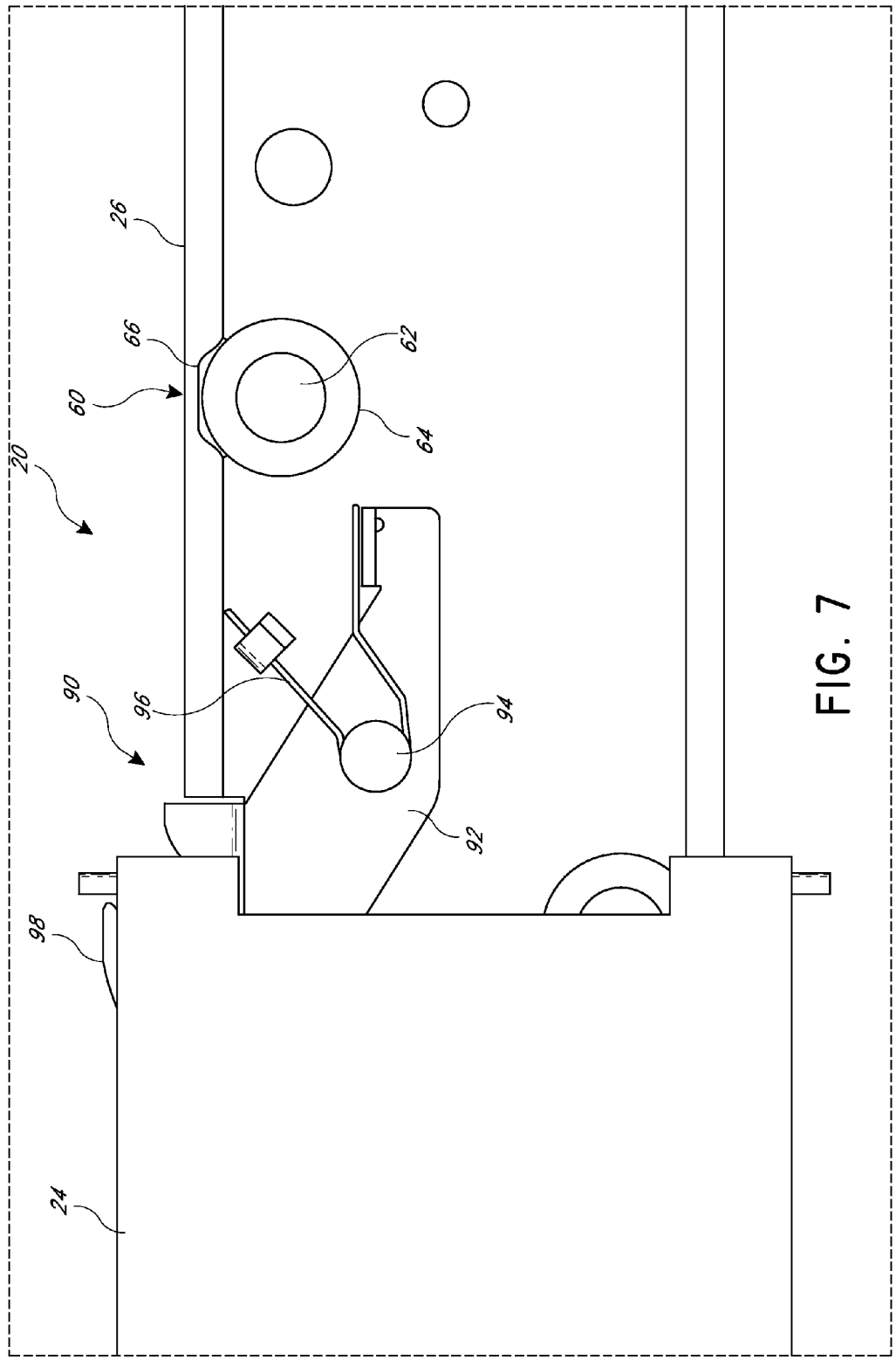
FIG. 7 is an enlarged, outboard side view of a portion of the slide assembly of FIG. 1, which shows a lock arrangement that secures the inner slide segment into an open position relative to an intermediate slide segment of the slide assembly.
Figure 8:
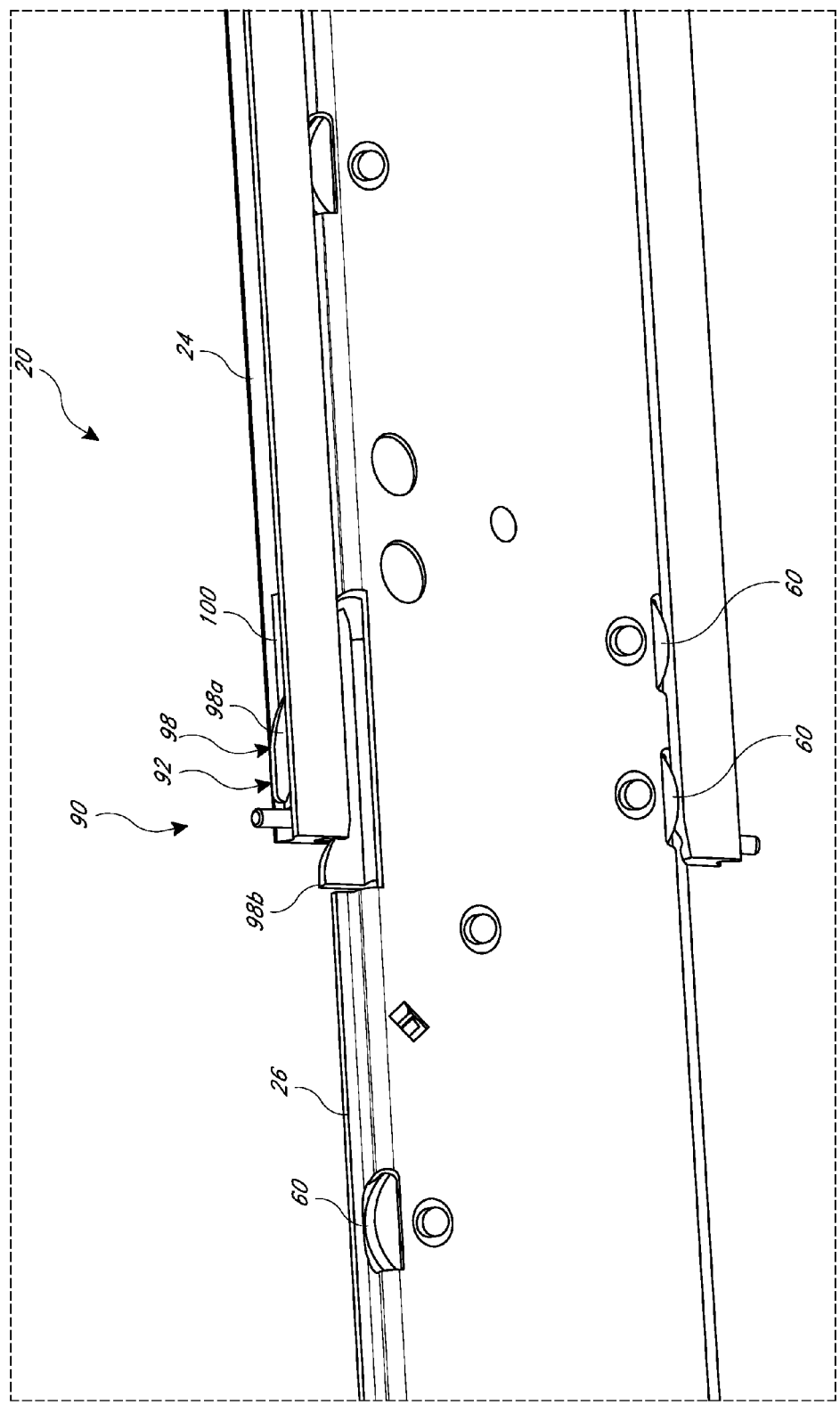
FIG. 8 is a perspective view of the top and inboard side of the portion of the slide assembly shown in FIG. 7.
Figure 9:
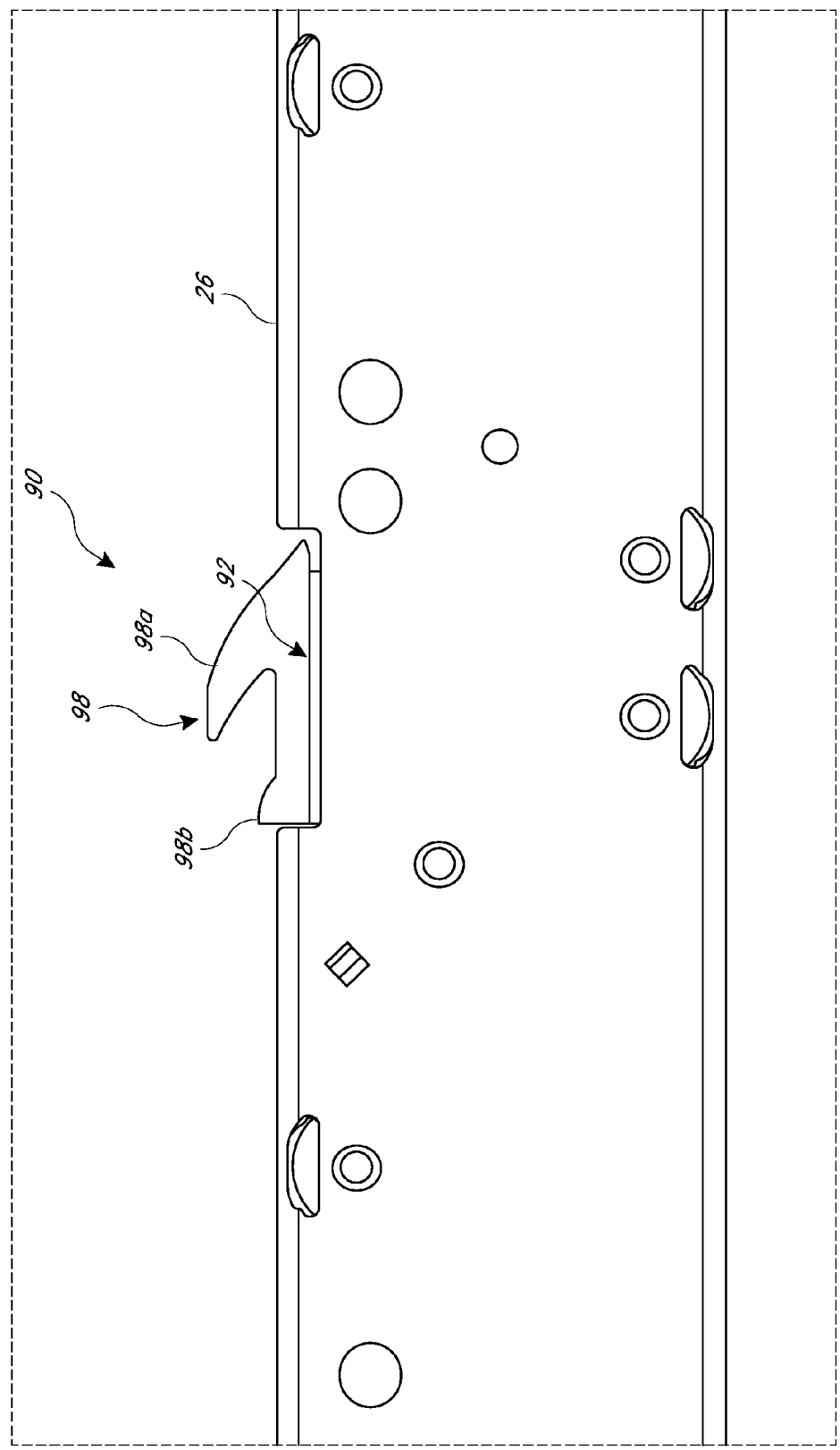
FIG. 9 is an inboard side view of the portion of the slide assembly shown in FIG. 7 with the intermediate slide segment removed to show an engagement portion of a lock arm of the lock arrangement.

With primary reference to FIG. 6, a locking device 104, such as a pin retention latch, spring arm or spring plate 106, may be associated with one or more of the keyholes 102 to secure the pin within the slot of the keyhole 102 once the pin is inserted. The spring plate 106 flexes to permit the head portion of the pin to pass through the opening of the keyhole 102 and then returns to its original position to inhibit the shaft portion of the pin from exiting the slot of the keyhole 102. The spring plate 106 can be secured to the inner slide segment 26 by any suitable arrangement, such as by a plurality (e.g., two) fasteners (e.g., rivets 108 or screws). Preferably, the fasteners 108 are located rearwardly of the associated keyhole 102 such that the pin applies a tensile force to the spring plate 106 when the slide assembly 20 is opened via the server (or other supported object). Advantageously, such an arrangement increases the durability of the spring plate 106 because it is stronger in tension than in compression and because the spring plate 106 could buckle in response to a compressive load. Moreover, as discussed above, it is often desirable to limit the cross-sectional width of the slide assembly 20, which also limits the thickness of the spring plate 106. Orienting the spring plate 106 as shown can permit the use of a thin material while maintaining adequate durability. The spring plate 106 can be formed or bent to define one or more features. For example, the spring plate 106 can define a recess that accommodates the head portion of the pin. A retention tab can extend behind the head portion of the pin to retain the pin within the slot of the keyhole 102. An angled tab can extend in an outboard direction and can provide a finger grip portion to allow the spring plate 106 to be flexed in an outboard direction to permit the pin to be removed from the keyhole 102 (and, thus, the server or other object to be separated from the inner slide segment 26/slide assembly 20). A semi-cylindrical flex zone can be provided to facilitate flexure of the spring plate 106 and reduce the stress at the rivets 108. The spring plate 106 can be of any suitable construction, such as any of the spring plates disclosed in U.S. Patent Publication No. 2012/0057812, which is assigned to the assignee of the present application.

The components of the slide assembly 20 may be constructed of any suitable material and by any suitable manufacturing process. However, in a particularly preferred embodiment, the slide assembly 20 is a hybrid steel/aluminum slide assembly. In particular, the outer slide segment 22 and intermediate slide segment 24 preferably are constructed from an aluminum material (e.g., 6061 or 7075 series aluminum, among other suitable types of aluminum) by a suitable process, such as a precision extrusion process. As a result, the cross sectional shape and dimensions can be precisely controlled such that little or no secondary processing (such as machining) is necessary for cross-sectional shape features such as the bearing surfaces. This is in contrast to common manufacturing methods of roll forming a steel material and then machining the bearing surfaces to the desired tolerances. However, it is noted that additional processes may be used to create lateral through-holes in the segments 22, 24, 26. Advantageously, with the preferred manufacturing method, the use of comparatively more expensive aluminum is offset by the elimination (or reduction) of secondary processing. In addition, preferably, the inner slide segment 26 is constructed from a steel material by any suitable process, including bending or roll forming techniques, for example but without limitation. In some configurations, the inner slide segment 26 is created from a flat sheet of material in a cutting step by a cutting machine, such as a laser cutter or turret press, and then formed into the desired cross-sectional shape, such as by a press brake or other bending machine. Alternatively, dedicated tools and/or equipment can be used to cut a flat work piece to length, add any through-holes, openings or other features. Secondary dedicated tools and/or equipment can then be used to shape the slide segment 26 into the desired cross-sectional shape and add any remaining through-holes, openings or other features. Advantageously, the use of the rollers 60 reduces or eliminates the need for secondary processing of the inner slide segment 26 because what would otherwise be the "bearing surfaces" are not utilized for contact with bearing members or direct sliding contact with the bearing surfaces of the intermediate slide segment 24.

In operation, the slide assembly 20 is coupled to the server rack. One of the brackets 34, 36 is coupled to the respective one of the forward or rearward vertical rails of the server rack. The bracket 36 is moved relative to the outer slide segment 22 (if necessary) to adjust the length of the mounting arrangement 28 such that the other of the brackets 34, 36 can be coupled to the other of the forward and rearward rails of the server rack. The position of the bracket 36 on the outer slide segment 22 can be fixed, such as by tightening the bolt-and-nut assemblies 42. Typically, another slide assembly 20 is secured to the other side of the server rack. A computer server can be connected to the slide assembly 20 by engaging the pins of the server with the keyholes 102 of the inner slide segment 26.

From a closed position, the computer server (or other object) can be moved to open (or extend) the slide assembly 20. As the slide assembly 20 is extended, the lock 70 engages to secure the intermediate slide segment 24 in an open position relative to the outer slide segment 22. The lock 90 then engages to secure the inner slide segment 26 in the open position. To retract the slide assembly 20, the lock 90 is released (either manually or automatically) and the inner slide segment 26 is retracted. The inner slide segment 26 contacts the latch 72 to disengage the lock 70, which permits the intermediate slide segment 24 to retract relative to the outer slide segment 22.

The slide assembly 20 can be constructed in various sizes including sizes corresponding to 1 U, 2 U, 3 U, 4 U, 5 U, 6 U and larger server arrangements. The embodiments described herein can be constructed and sized to a desired server size/arrangement and each embodiment may also be constructed and sized to other applications outside of computers and servers.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In particular, while the present slide assemblies have been described in the context of particularly preferred embodiments, the skilled artisan will appreciate, in view of the present disclosure, that certain advantages, features and aspects of the assemblies may be realized in a variety of other applications, many of which have been noted above. Additionally, it is contemplated that various aspects and features of the invention described can be practiced separately, combined together, or substituted for one another, and that a variety of combination and subcombinations of the features and aspects can be made and still fall within the scope of the invention. Thus, it is intended that the scope of the present invention herein disclosed should not be limited by the particular disclosed embodiments described above, but should be determined only by a fair reading of the claims.

What is claimed is:

1. A slide assembly, comprising:
    a mounting arrangement that permits the slide assembly to be mounted to a supporting structure, the mounting arrangement comprising a first bracket and a second bracket, wherein a position of at least one of the first bracket and the second bracket is adjustable in a longitudinal direction of the slide assembly to permit a length adjustment of the mounting arrangement;
    an outer slide segment having a first bearing surface and a second bearing surface;
    at least one intermediate slide segment telescopically engaged with the outer slide segment, the at least one intermediate slide segment having a first bearing surface and a second bearing surface, wherein the first and second bearing surfaces of each of the outer slide segment and the at least one intermediate slide segment transfer a load applied to the slide assembly between the outer slide segment and the at least one intermediate slide segment;
    an inner slide segment telescopically engaged with the at least one intermediate slide segment, the inner slide segment comprising a plurality of rollers separated into an upper row and a lower row, wherein the plurality of rollers contact the intermediate slide segment to transfer the load applied to the slide assembly between the inner slide segment and the intermediate slide segment, wherein a rearward upper roller and lower roller of the inner slide segment are positioned toward the forward end of the intermediate slide segment when the slide assembly is open;
    a plurality of keyholes defined by the inner slide segment, wherein, in use, the keyholes receive mounting pins of an object supported by the slide assembly, wherein the plurality of keyholes comprise keyhole pairs, each of which include an upper keyhole and a lower keyhole spaced from one another;
    a first lock that secures the intermediate slide segment in an open position relative to the outer slide segment, wherein the first lock comprises a spring lock arm secured to the outer slide segment and that extends through an opening in the outer slide segment to engage the intermediate slide segment, and wherein the inner slide segment contacts the spring lock arm to disengage the spring lock arm from the intermediate slide segment;
    a second lock that secures the inner slide segment in an open position relative to the intermediate slide segment, wherein the second lock comprises a latch that engages an opening in a flange portion of the intermediate slide segment; wherein the latch comprises a hook and a protrusion, the hook passes through the opening in the flange portion and the protrusion is positioned forward of the intermediate slide segment;
    wherein at least one of the slide segments is constructed from an aluminum material and wherein at least one of the slide segment is constructed from a steel material.

2. The slide assembly of claim 1, wherein the outer slide segment and the at least one intermediate slide segment are made from aluminum material.

3. The slide assembly of claim 2, wherein the inner slide segment is constructed from a steel material.

4. The slide assembly of claim 1, wherein the mounting arrangement comprises a plurality of pins carried by each of the first bracket and the second bracket, wherein each of the pins are cylindrical in shape and include a central through-hole.

5. The slide assembly of claim 4, wherein the first bracket is positioned at a forward end of the outer slide segment and includes four pins and the second bracket is positioned at a rearward end of the outer slide segment and includes two pins.

6. The slide assembly of claim 1, further comprising a pin retention latch associated with one of the plurality of keyholes and which prevents removal of a pin received in the associated keyhole.

7. The slide assembly of claim 6, wherein the pin retention latch is secured to the inner slide segment by at least one fastener positioned rearwardly of the associated keyhole.

8. The slide assembly of claim 1, wherein each of the plurality of rollers comprises a hub and a roller portion, wherein at least the roller portion is constructed from a plastic material.

9. The slide assembly of claim 8, wherein the hub is constructed from a metal material.

10. A slide assembly, comprising:
    a mounting arrangement that permits the slide assembly to be mounted to a supporting structure, the mounting arrangement comprising a first bracket at a forward end of the slide assembly and a second bracket at a rearward end of the slide assembly, wherein a position of the second bracket is adjustable in a longitudinal direction of the slide assembly to permit a length adjustment of the mounting arrangement;
    an outer slide segment having a first bearing surface and a second bearing surface;
    at least one intermediate slide segment telescopically engaged with the outer slide segment, the at least one intermediate slide segment having a first bearing surface and a second bearing surface, wherein the first and second bearing surfaces of each of the outer slide segment and the at least one intermediate slide segment transfer a load applied to the slide assembly between the outer slide segment and the at least one intermediate slide segment;

an inner slide segment telescopically engaged with the at least one intermediate slide segment, the inner slide segment comprising a plurality of rollers separated into an upper row and a lower row, wherein the plurality of rollers contact the intermediate slide segment to transfer the load applied to the slide assembly between the inner slide segment and the intermediate slide segment, wherein a rearward upper roller and lower roller of the inner slide segment are positioned toward the forward end of the intermediate slide segment when the slide assembly is open;

a plurality of keyholes defined by the inner slide segment, wherein, in use, the keyholes receive mounting pins of an object supported by the slide assembly, wherein the plurality of keyholes comprise keyhole pairs, each of which include an upper keyhole and a lower keyhole spaced from one another;

wherein at least one of the slide segments is constructed from an aluminum material and wherein at least one of the slide segment is constructed from a steel material.

11. The slide assembly of claim 10, wherein the outer slide segment and the at least one intermediate slide segment are made from aluminum material.

12. The slide assembly of claim 11, wherein the inner slide segment is constructed from a steel material.

13. The slide assembly of claim 10, wherein the mounting arrangement comprises a plurality of pins carried by each of the first bracket and the second bracket, wherein each of the pins are cylindrical in shape and include a central through-hole.

14. The slide assembly of claim 13, wherein the first bracket includes four pins and the second bracket includes two pins.

15. The slide assembly of claim 10, further comprising a pin retention latch associated with one of the plurality of keyholes and which prevents removal of a pin received in the associated keyhole.

16. The slide assembly of claim 15, wherein the pin retention latch is secured to the inner slide segment by at least one fastener positioned rearwardly of the associated keyhole.

17. The slide assembly of claim 10, wherein each of the plurality of rollers comprises a hub and a roller portion, wherein at least the roller portion is constructed from a plastic material.

18. The slide assembly of claim 17, wherein the hub is constructed from a metal material.

* * * * *